US006962111B2

(12) United States Patent
Tanaka et al.

(10) Patent No.: US 6,962,111 B2
(45) Date of Patent: Nov. 8, 2005

(54) SCREEN-PRINTING PLATE, MANUFACTURING METHOD OF LAMINATED-CERAMIC ELECTRONIC DEVICES, AND LAMINATED-CERAMIC ELECTRONIC DEVICE MANUFACTURED BY THE METHOD

(75) Inventors: Kazuma Tanaka, Takefu (JP); Yuki Yamamoto, Sabae (JP); Takaaki Kawai, Sabae (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/873,375

(22) Filed: Jun. 5, 2001

(65) Prior Publication Data

US 2002/0020310 A1 Feb. 21, 2002

(30) Foreign Application Priority Data

Jun. 15, 2000 (JP) ......................................... 2000-180087

(51) Int. Cl.[7] ............................................. B05C 17/06
(52) U.S. Cl. ........................ 101/127; 101/129; 118/213; 118/406
(58) Field of Search ................................ 101/114, 127, 101/127.1, 129; 118/213, 406

(56) References Cited

U.S. PATENT DOCUMENTS

| | | | | |
|---|---|---|---|---|
| 3,225,691 A | * | 12/1965 | Kehe et al. | 101/127 |
| 3,769,908 A | * | 11/1973 | Griffin | 101/127 |
| 4,084,506 A | * | 4/1978 | Nakatani | 101/127 |
| 4,872,261 A | * | 10/1989 | Sanyal et al. | 101/127 |
| 5,669,970 A | * | 9/1997 | Balog et al. | 101/126 |
| 6,095,041 A | * | 8/2000 | Comino et al. | 101/127 |
| 6,354,200 B1 | * | 3/2002 | Takeuchi et al. | 101/127 |

FOREIGN PATENT DOCUMENTS

| | | |
|---|---|---|
| JP | 60-263156 | 12/1985 |
| JP | 63-116893 | 5/1988 |
| JP | 3-281391 | 12/1991 |
| JP | 4-259556 | 9/1992 |
| JP | 6-938 | 1/1994 |
| JP | 6-27166 | 4/1994 |
| JP | 06349663 A | 12/1994 |
| JP | 6-349663 | 12/1994 |
| JP | 10-202824 | 8/1998 |
| JP | 11-042867 | 2/1999 |

OTHER PUBLICATIONS

Singapore Search Report Apr. 2002.

* cited by examiner

*Primary Examiner*—Ren Yan
(74) *Attorney, Agent, or Firm*—Burns, Doane, Swecker & Mathis, L.L.P.

(57) ABSTRACT

A screen-printing plate is provided with a plurality of printing patterns disposed in a single plate frame. Each printing pattern is formed with a plurality of mesh holes. At least two different aperture ratios of the mesh holes forming the printing patterns are provided according to the positions of regions on the screen-printing plate in which the printing patterns are disposed. The aperture ratio of the mesh holes forming the printing patterns positioned in a region close to the periphery of the plate frame is set higher than the aperture ratio of the mesh holes forming the printing patterns positioned in a central region of the plate frame.

22 Claims, 5 Drawing Sheets

SCREEN-PRINTING PLATE, MANUFACTURING METHOD OF LAMINATED-CERAMIC ELECTRONIC DEVICES, AND LAMINATED-CERAMIC ELECTRONIC DEVICE MANUFACTURED BY THE METHOD

BACKGROUND OF THE INVENTION

1. Field of the Invention

The present invention relates to screen-printing plates, a method for manufacturing laminated-ceramic electronic devices in a process of laminating ceramic green sheets provided with electrode patterns formed by using the screen-printing plate, and a laminated-ceramic electronic device manufactured by the method.

2. Description of the Related Art

Generally, laminated-ceramic electronic devices are manufactured in processes of laminating and contact-bonding a predetermined number of ceramic green sheets provided with a plurality of internal electrode patterns formed by printing or applying electrode paste, cutting the laminated ceramic sheets into individual elements, and firing the elements.

In accordance with recent advances in miniaturization of electronic apparatuses, the laminated-ceramic electronic devices have been reduced in size and been improved in performance. In particular, a laminated-ceramic capacitor has a trend toward a larger number of laminations, in which the lamination of internal electrodes and dielectrics is increased to achieve miniaturization and larger capacity.

However, when intending to increase the number of laminations of the internal electrodes and the dielectrics and when a predetermined number of ceramic green sheets provided with the internal electrode patterns are contact-bonded to each other, a problem has been found in that regions in which the internal electrode patterns are provided and the regions in which the internal electrode patterns are not provided differ in level, or height, from each other, whereby defects of the internal structure, such as delamination, are likely to be produced.

The above difference in level is produced by laminating the ceramic green sheets provided with the internal electrode patterns. However, the difference in level is not caused only by providing the internal electrode patterns, and is sometimes produced also by variations in the coating thickness between each internal electrode pattern.

Therefore, it is also an important task to reduce the variations in the coating thickness between the internal electrode patterns in order to reduce the difference in level and to increase the number of laminations.

Figure 7:
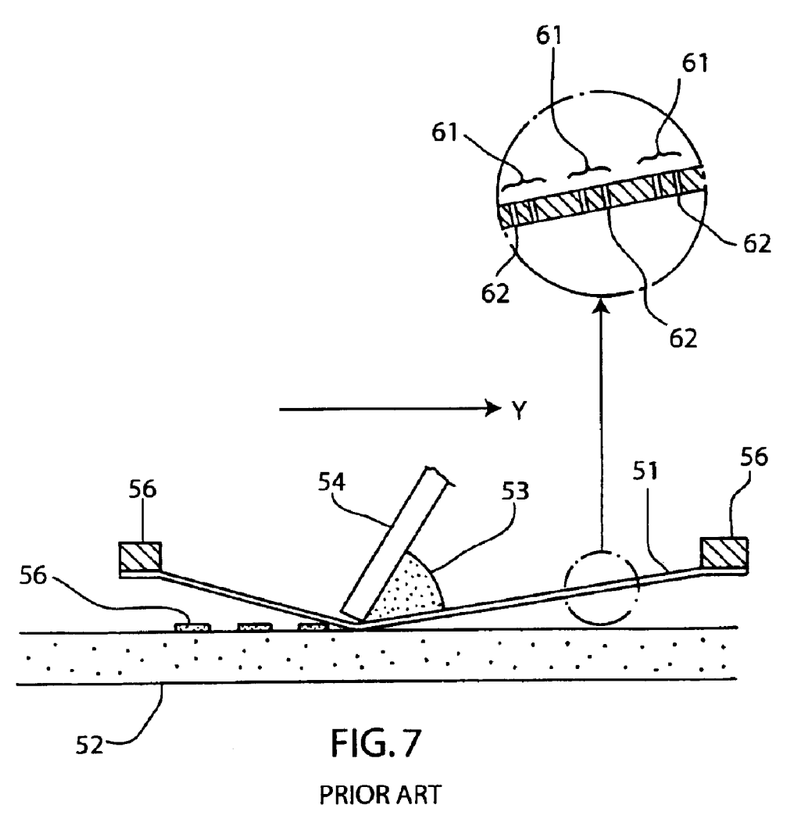
FIG. 7 is a cross-sectional view showing a process of a known screen-printing method.
Figure 8:
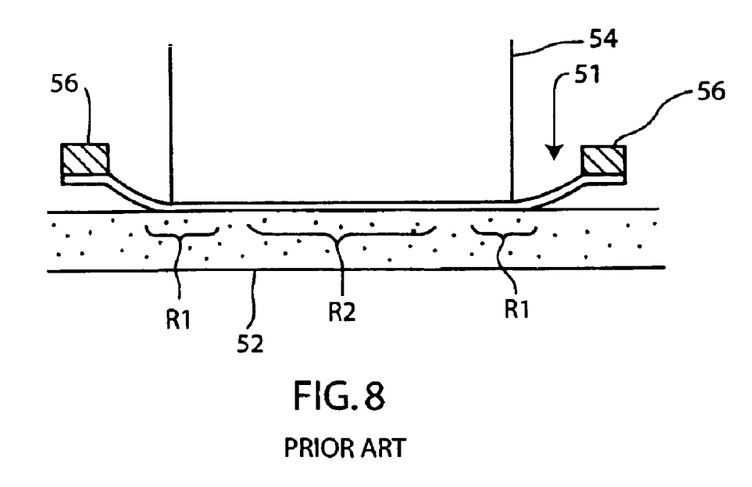
FIG. 8 is a longitudinal-sectional view showing the process of the known screen-printing method.

Hitherto, a screen-printing method has been used for printing electrode paste on a ceramic green sheet. As shown in FIGS. 7 and 8, in the screen-printing method, a screen-printing plate 51 provided with a plurality of mesh holes 62 so as to form a plurality of printing patterns 61 is disposed on a ceramic green sheet 52, electrode paste 53 is supplied onto the screen-printing plate 51, and a squeegee 54 is moved in a predetermined direction, for example, in a direction of an arrow Y in FIG. 7 while the squeegee 54 is pressed onto the screen-printing plate 51, whereby the electrode paste 53 passes through the mesh holes 62 forming the printing patterns 61 of the screen-printing plate 51, the electrode paste 53 is printed on the ceramic green sheet 52, and predetermined electrode patterns 55 are formed.

However, in the above screen-printing method, tension is not applied evenly to the overall screen-printing plate 51 when the squeegee 54 is moved while being pressed. Effective pressure applied to the printing patterns 61 in a region R1 disposed in the vicinity of the periphery and close to a frame 56 tends to become greater than the effective pressure applied to the printing patterns 61 in a central region R2 which is disposed separated from the frame 56, as shown in FIG. 8. Therefore, the screen-printing plate 51 tends to expand more in the region R1 close to the periphery than in the central region R2. As a result, the coating of the electrode pattern 55 becomes thinner in the region R1 close to the periphery than in the central region R2, and there occurs a problem in that variations in the coating thickness of a plurality of the electrode patterns 55 printed by using one screen-printing plate 51 are produced. The problem is that the variations in the coating thickness have an unfavorable effect regarding the production of difference in level of the ceramic green sheets after laminated and contact-bonded.

A related technology is known, which is a method in which the sizes of mesh holes in a single printing pattern, which is formed by providing the mesh holes in a screen-printing plate, are made different from each other (refer to, for example, Japanese Unexamined Patent Application Publication No. 6-349663). However, the fact is that any effective method has not been developed particularly for avoiding variations in the coating thickness between a plurality of the electrode patterns 55, as described above, which are printed by using the screen printing plate 51 provided with a plurality of printing patterns in a plate frame of the screen printing plate 51.

SUMMARY OF THE INVENTION

Accordingly, it is an object of the present invention to provide a screen-printing plate which prints a plurality of electrode patterns in which variations in the coating thickness between the plurality of electrode patterns can be avoided, and to provide a laminated-ceramic electronic device manufactured by using the screen-printing plate, in which defects of the internal structure are reduced.

To these ends, according to an aspect of the present invention, a screen-printing plate comprises a screen plate provided with a plurality of printing patterns disposed in a single plate frame of the screen plate, each printing pattern being formed with a plurality of mesh holes. At least two different aperture ratios of the mesh holes forming the printing patterns are provided according to the positions of regions in which the printing patterns are formed.

With this arrangement in which at least two different aperture ratios of the mesh holes forming the plurality of printing patterns are provided according to the positions of regions in which the printing patterns are disposed, variations in the coating thickness between electrode patterns printed by using the screen-printing plate can be suppressed.

For example, when a squeegee presses given region of a screen printing plate such as a region in the vicinity of the periphery (peripheral region) of the screen-printing plate and expands that given region more than another region such as a central region by a squeegee pressed to the screen-printing plate, and the coating thickness of the electrode patterns becomes smaller, or thinner, in the given region (in the peripheral region) than in the other region (the central region) when the proportion of aperture area (the aperture ratio) of the mesh holes to a unit area is the same, the aperture ratio of the mesh holes is set so as to be increased in the peripheral region and is set so as to be decreased in the central region, that is, the aperture ratio varies according to the regions provided with the printing patterns, whereby variations in the coating thickness between the electrode patterns can be suppressed or avoided.

In the screen-printing plate according to the present invention, the aperture ratio of the mesh holes forming the printing patterns disposed in the vicinity of the periphery of the plate frame may be set higher than the aperture ratio of the mesh holes forming the printing patterns disposed toward the inner side from the vicinity of the periphery of the plate frame.

When the electrode paste is printed by pressing the squeegee to the screen-printing plate, the screen-printing plate tends to expand more in the peripheral region than in the central region. By setting the aperture ratio of the mesh holes higher in the printing patterns disposed in the vicinity of the periphery of the plate frame than in the printing patterns disposed at the inner side of the vicinity of the periphery of the plate frame, more conductive paste can be supplied through the printing patterns disposed in the vicinity of the periphery of the screen-printing plate, thereby suppressing or avoiding variations in the coating thickness between the electrode patterns.

According to another aspect of the present invention, a method for manufacturing a laminated-ceramic electronic device comprises the step of preparing a plurality of ceramic green sheets in which variations in the coating thickness between the printing patterns are reduced by using a screen-printing plate which includes a screen plate provided with a plurality of printing patterns disposed in a single plate frame of the screen plate, each printing pattern being formed with a plurality of mesh holes. At least two different aperture ratios of the mesh holes forming the printing patterns are provided according to the positions of regions in which the printing patterns are formed. The method also comprises the steps of laminating and contact-bonding the plurality of ceramic green sheets, each provided with a plurality of electrode patterns; cutting the laminated and contact-bonded layered product into independent elements; and firing the cut elements.

A predetermined number of ceramic green sheets are laminated, are contact-bonded, are cut into independent elements, and are fired, the ceramic green sheets being provided with a plurality of electrode patterns formed by using the screen-printing plate according to the present invention, in which variations in the coating thickness between the electrode patterns are reduced, whereby a reliable laminated-ceramic electronic device, in particular, a laminated-ceramic capacitor can be efficiently manufactured, the laminated-ceramic capacitor having a reduced-size and large capacity in which the number of laminations can be increased and structural defects are not likely to occur.

According to a further aspect of the present invention, a laminated-ceramic electronic device is provided, which includes a structure in which internal electrodes are laminated on each other with a ceramic layer therebetween and is manufactured by a method comprising the step of preparing a plurality of ceramic green sheets, in which variations in the coating thickness between the printing patterns are reduced, by using a screen-printing plate which includes a screen plate provided with a plurality of printing patterns disposed in a single plate frame of the screen plate, each printing pattern being formed with a plurality of mesh holes. At least two different aperture ratios of the mesh holes forming the printing patterns are provided according to the positions of regions in which the printing patterns are formed. The method also comprises the steps of laminating and contact-bonding the plurality of ceramic green sheets, each provided with a plurality of electrode patterns; cutting the laminated and contact-bonded layered product into independent elements; and firing the cut elements.

Since the laminated-ceramic device is manufactured by the method in which a predetermined number of the ceramic green sheets provided with a plurality of the electrode patterns, between which variations in the coating thickness are reduced, are laminated, are contact-bonded, are cut, and are fired under a predetermined condition, a high reliability can be ensured with defects of the internal structure being reduced even when the number of laminations increases.

DESCRIPTION OF THE PREFERRED EMBODIMENTS

An embodiment according to the present invention is shown below, whereby the characteristics of the present invention will be described further in detail.

The embodiment is described by using a screen-printing plate as an example which forms electrode patterns (printed patterns) as internal electrodes on ceramic green sheets which are used for manufacturing a laminated-ceramic capacitor.

Figure 1:
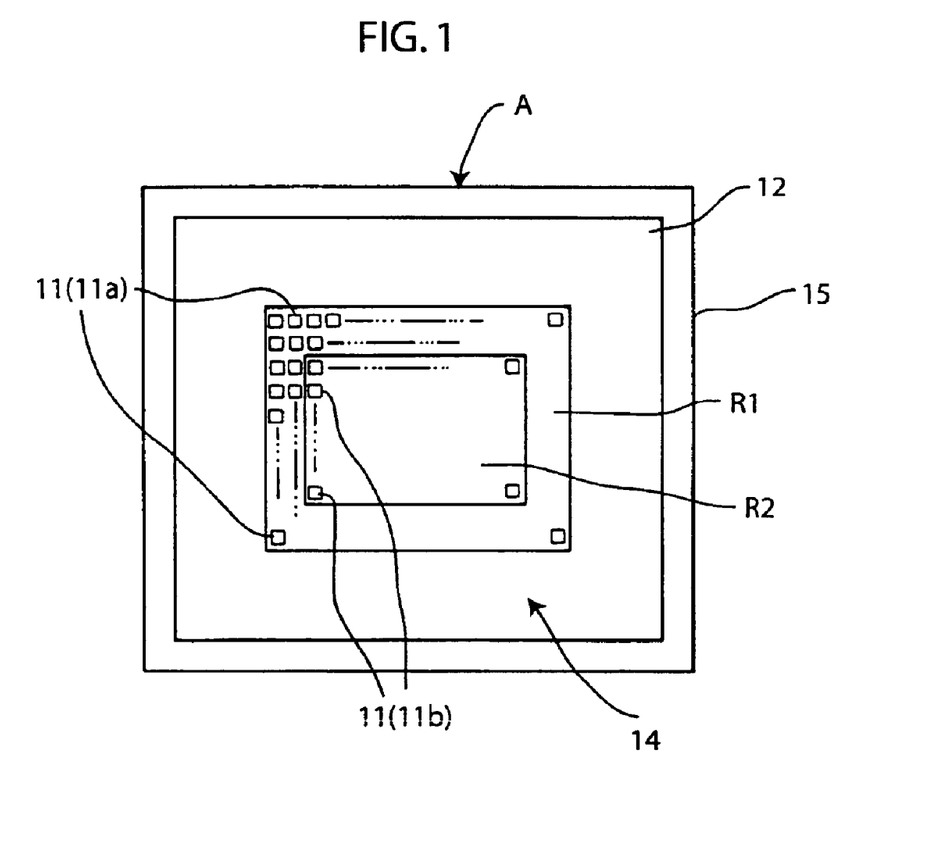
FIG. 1 is a plan view of a screen-printing plate according to an embodiment of the present invention.
Figure 2A:
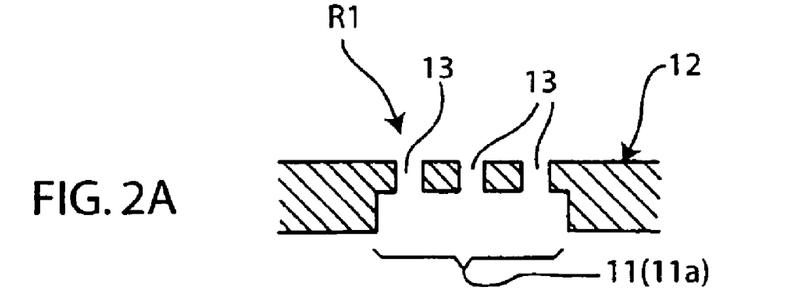
FIGS. 2A and 2B are a sectional view and a bottom view, respectively, of a pattern structure of a printing pattern in a region in the vicinity of the periphery of the screen-printing plate shown in FIG. 1.
Figure 2B:
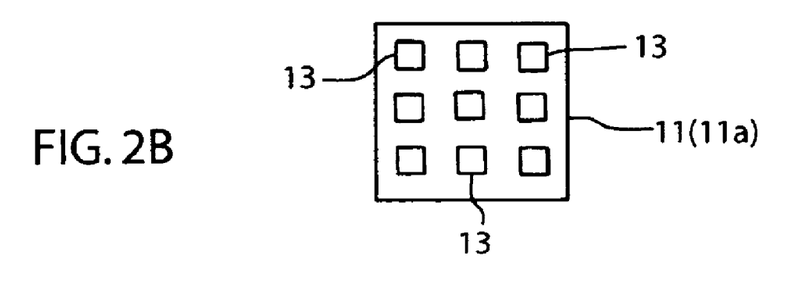
Figure 3A:
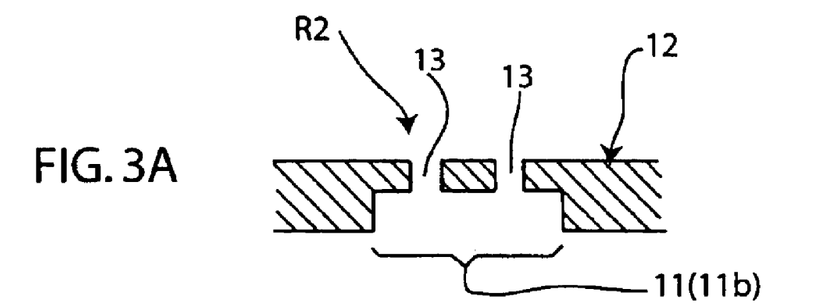
FIGS. 3A and 3B are a sectional view and a bottom view, respectively, of the pattern structure of the printing pattern in a central region of the screen-printing plate shown in FIG. 1.
Figure 3B:
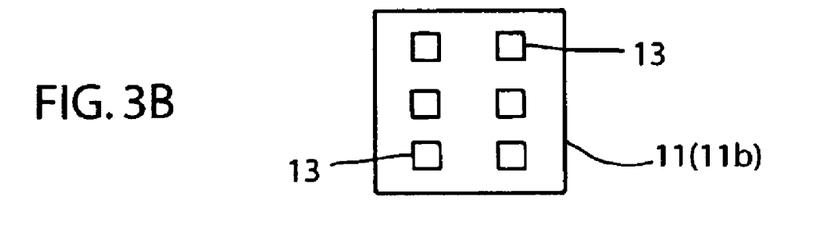

FIG. 1 is a plan view of a screen-printing plate according to the embodiment of the present invention. FIG. 2A is a sectional view showing a pattern structure of a printing pattern 11 (11*a*) formed in a peripheral region R1 in the vicinity of the periphery (marginal edges) of a screen-printing plate A shown in FIG. 1. FIG. 2B is a bottom view of the pattern structure shown in FIG. 2A. FIG. 3A is a sectional view showing the pattern structure of a printing pattern 11 (11*b*) formed in a central region R2 of the screen-printing plate shown in FIG. 1. FIG. 3B is a bottom view of the pattern structure shown in FIG. 3A.

Figure 4:
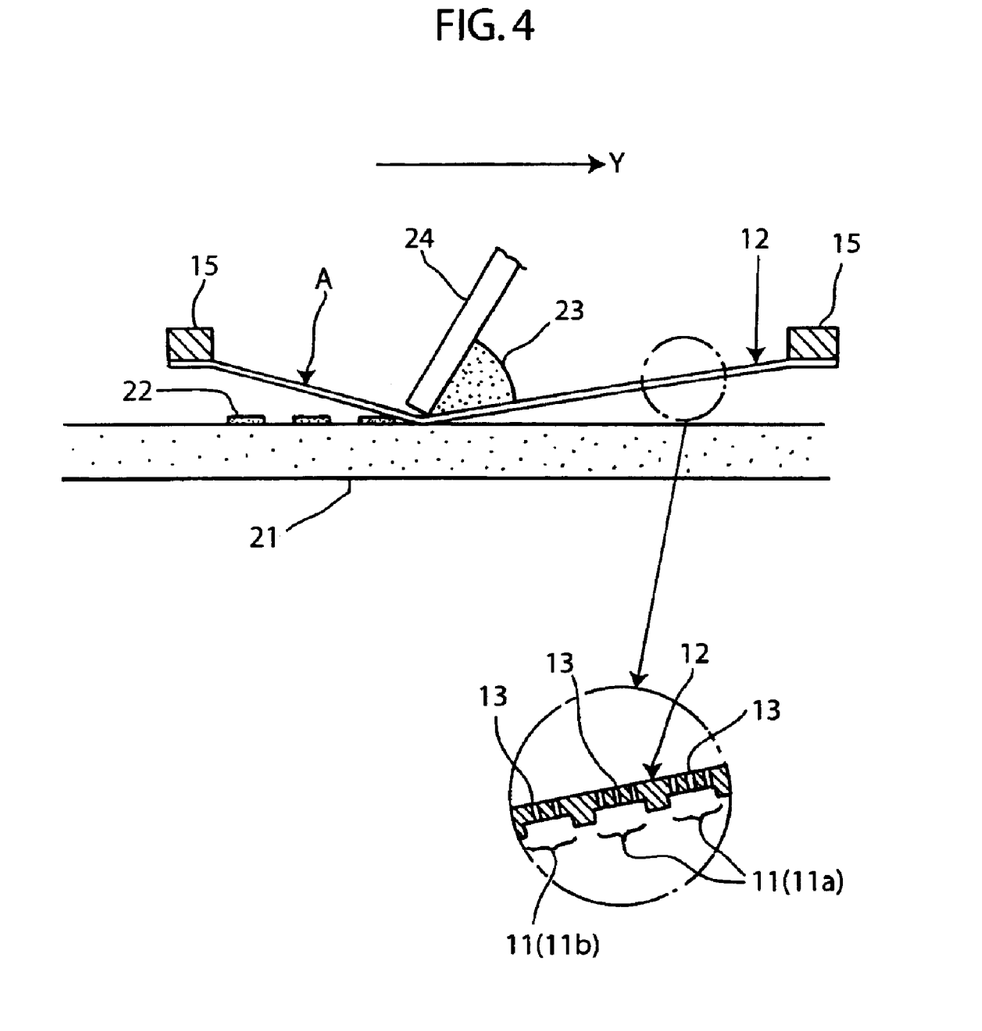
FIG. 4 is an illustration of a state in which electrode patterns (printed patterns) are printed on a ceramic green sheet by using the screen-printing plate according to the embodiment of the present invention.
Figure 5:
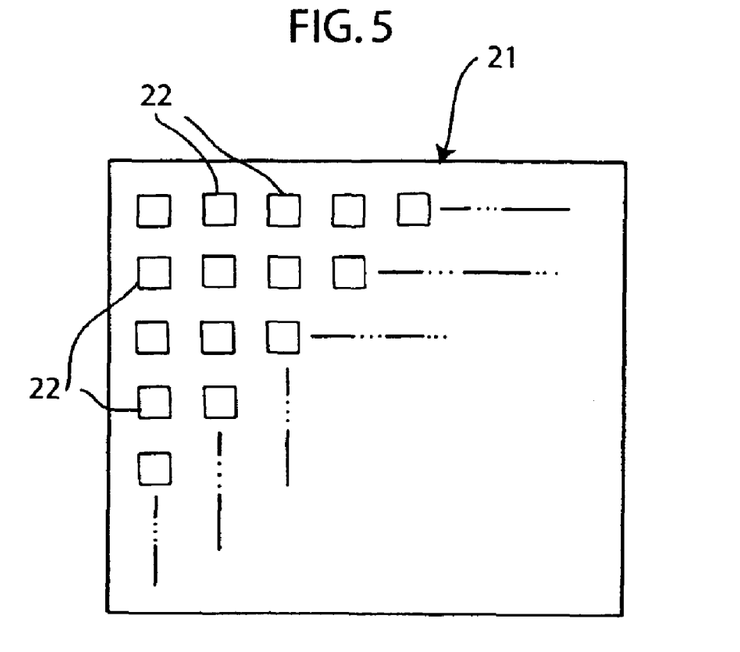
FIG. 5 is an illustration of the ceramic green sheet printed with the electrode patterns (printed patterns) by using the screen-printing plate according to the embodiment of the present invention.

As shown in FIGS. 4 and 5, the screen-printing plate A includes, for example, a stainless screen plate 12 including a plate frame 14 in which a plurality of printing patterns 11 are disposed, so that a plurality of electrode patterns (printed patterns) 22 can be printed on a ceramic green sheet 21 in a desired shape. The screen plate 12 is supported by a frame 15 at the periphery of the screen plate 12.

As shown in FIGS. 1, 2, and 3, the printing patterns 11 of the screen plate 12 are formed with mesh holes 13 formed in a predetermined position of the screen plate 12.

In the screen-printing plate A according to the present embodiment, the aperture ratio of the mesh holes 13 forming the printing patterns 11 (11a) positioned in the peripheral region R1 in the vicinity of the periphery (marginal edges) of the plate frame 14 is set higher than the aperture ratio of the mesh holes 13 forming the printing patterns 11 (11b) positioned in the central region R2, as shown in FIGS. 2 and 3.

In particular, according to the present embodiment, one printing pattern 11 (11a) in the peripheral region R1 is formed with nine mesh holes 13, and one printing pattern 11 (11b) in the central region R2 is formed with six mesh holes 13, as shown in FIGS. 2 and 3, whereby the aperture ratio of the mesh holes 13 forming the printing patterns 11 (11a) in the peripheral region R1 becomes 30%, and the aperture ratio of the mesh holes 13 forming the printing patterns 11 (11b) in the central region R2 becomes 20%.

The screen-printing plate A provided with a plurality of the printing patterns 11 was disposed on the ceramic green sheet 21, electrode paste 23 was supplied onto the screen-printing plate A, and a squeegee 24 was moved in a predetermined direction, for example, in a direction of an arrow Y in FIG. 4 while being pressed onto the screen-printing plate A, whereby the electrode paste 23 passed through the mesh holes 13 forming the printing patterns 11 of the screen-printing plate A, the electrode paste 23 was printed on the ceramic green sheet 21, and predetermined electrode patterns 22 were formed (see FIG. 5). The coating thickness of each electrode pattern (printed pattern) 22 was measured, and the degree of variations in the thickness was examined.

For comparison, a screen-printing plate as a comparative example was prepared, which was provided with the same printing patterns as those in the central region R2 according to the present embodiment, that is, the printing patterns had the same aperture ratio of the mesh holes of 20% as each other in the peripheral region R1 and in the central region R2 of the comparative example. By using the comparative example of the screen-printing plate, a plurality of electrode patterns (printed patterns) were printed on a ceramic green sheet, the coating thickness of each electrode pattern (printed pattern) was measured, and the degree of variations in the thickness was examined.

The result is shown in table 1.

TABLE 1

|  | Comparative example | Example according to the embodiment of the invention |
|---|---|---|
| Average coating thickness (mm) | 0.70 | 0.70 |
| Greatest coating thickness (mm) | 0.95 | 0.80 |
| Smallest coating thickness (mm) | 0.55 | 0.65 |
| Variations (CV) (%) | 15.1 | 7.5 |

TABLE 1-continued

|  | Peripheral region | Central region | Peripheral region | Central Region |
|---|---|---|---|---|
| Average coating thickness (mm) | 0.62 | 0.81 | 0.70 | 0.72 |
| Greatest coating thickness (mm) | 0.71 | 0.95 | 0.78 | 0.80 |
| Smallest coating thickness (mm) | 0.55 | 0.62 | 0.65 | 0.69 |
| Aperture rate of screen (%) | 20 | 20 | 30 | 20 |

As shown in table 1, when the comparative example of the screen printing plate was used, the average coating thickness of the electrode patterns (printed patterns) was 0.70 mm, in which the greatest coating thickness was 0.95 mm, the smallest coating thickness was 0.55 mm, and the variations (CV value) was 15.1%.

When the screen printing plate A according to the embodiment of the present invention was used, the average coating thickness of the electrode patterns (printed patterns) was 0.70 mm, in which the greatest coating thickness was 0.80 mm, the smallest coating thickness was 0.65 mm, and the variations (CV value) was 7.5%. It is shown that the variations (CV value) in the coating thickness between each electrode pattern (printed pattern) were significantly reduced compared with the case in which the comparative example of the screen-printing plate was used.

Concerning the coating thickness of the electrode patterns (printed patterns) in the peripheral region R1 and the central region R2 when using the comparative example of the screen-printing plate, in the peripheral region R1, the average coating thickness of the electrode patterns (printed patterns) was 0.62 mm, the greatest coating thickness was 0.71 mm, and the smallest coating thickness was 0.55 mm, and in the central region R2, the average coating thickness of the electrode patterns (printed patterns) was 0.81 mm, the greatest coating thickness was 0.95 mm, and the smallest coating thickness was 0.62 mm. The average coating thickness, the greatest coating thickness, and the smallest coating thickness of the electrode patterns (printed patterns) in the peripheral region R1 were respectively smaller than those of the electrode patterns (printed patterns) in the central region R2.

Concerning the coating thickness of the electrode patterns (printed patterns) in the peripheral region R1 and the central region R2 when using the example of the screen-printing plate according to the embodiment of the present invention, in the peripheral region R1, the average coating thickness of the electrode patterns (printed patterns) was 0.70 mm, the greatest coating thickness was 0.78 mm, and the smallest coating thickness was 0.65 mm, and in the central region R2, the average coating thickness of the electrode patterns (printed patterns) was 0.72 mm, the greatest coating thickness was 0.80 mm, and the smallest coating thickness was 0.69 mm. It is shown that the average coating thickness, the greatest coating thickness, and the smallest coating thickness of the electrode patterns (printed patterns) in the peripheral region R1 were respectively close to those of the electrode patterns (printed patterns) in the central region R2, and the variations were small.

By using the screen-printing plate according to the embodiment of the present invention, as described above, variations in the coating thickness between a plurality of electrode patterns printed by using one screen-printing plate can be effectively reduced.

Figure 6:
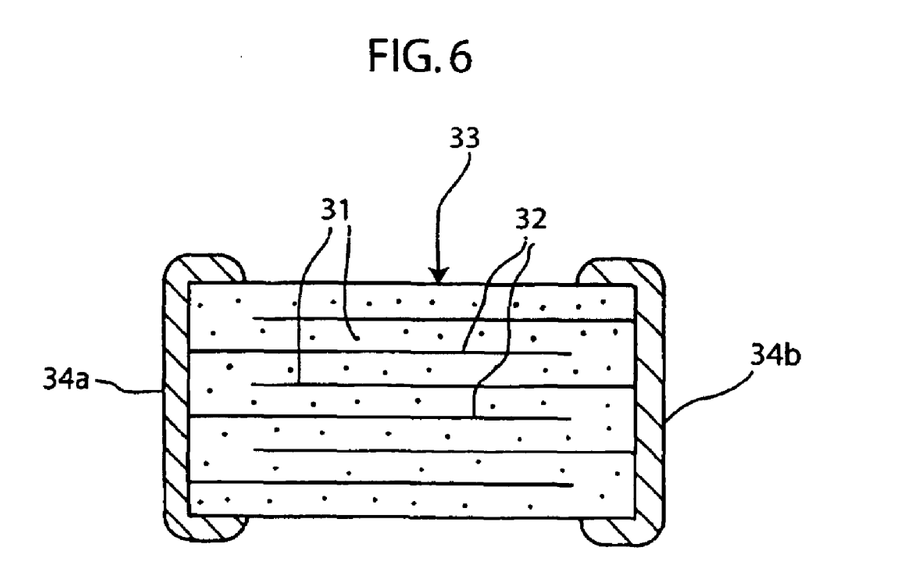
FIG. 6 is a sectional view of a laminated-ceramic capacitor manufactured in a process of laminating the ceramic green sheets provided with the electrode patterns by using the screen-printing plate according to the embodiment of the present invention.

A predetermined number of the ceramic green sheets provided with the electrode patterns of which the variations in the coating thickness are reduced, as described above, are laminated on each other, ceramic green sheets (sheets for outer layers) which are not provided with electrode patterns are laminated on the uppermost and lowermost ceramic green sheets provided with the electrode patterns, respectively, are contact-bonded to each other, and are cut into independent elements. The cut elements are individually provided with external electrodes formed in predetermined positions of the elements, whereby laminated-ceramic capacitors are obtainable, as shown in FIG. 6, each provided with a pair of external electrodes 34a and 34b, which are individually connected to internal electrodes 32, at ends of an element 33 in which a plurality of the internal electrodes 32 are laminated on each other with a ceramic layer 31 therebetween.

The laminated ceramic capacitor is manufactured by laminating the ceramic green sheets provided with the electrode patterns of which variations in the coating thickness are reduced, thereby reducing defects of the internal structure, such as delamination, and realizing high reliability.

Although in the above embodiment, the mesh holes 13 in each printing pattern 11 (11a) are disposed more in the peripheral region R1 than in the central region R2 so that the aperture ratio of the mesh holes 13 in the peripheral region R1 differs from that in the central region R2, the aperture ratio of the mesh holes 13 forming the printing patterns 11 (11a) in the peripheral region R1 and the aperture ratio of the mesh holes 13 forming the printing patterns 11 (11b) in the central region R2 may be set different from each other with the mesh holes 13 having sizes differing from each other instead of changing the number of the mesh holes 13.

The present invention is not limited to the above embodiment, and the embodiment may includes various applications and modifications within the spirit and scope of the present invention regarding the material of the screen plate, the particular shape and layout of the mesh holes, the relationship of positions between the regions in which the rates of aperture differ from each other, the number of regions in which the rates of aperture differ from each other, the type of substance to be printed, such as electrode paste or the like.

What is claimed is:

1. A screen-printing plate comprising:
a screen plate provided with two or more printing patterns disposed in a single plate frame of the screen plate, each of the two or more printing patterns being formed as a single opening on one surface of the screen plate and a plurality of mesh holes on an opposite surface of the screen plate,
wherein, for two of the two or more printing patterns, the shapes of the two printing patterns are substantially the same and the first printing pattern has mesh holes of a first size and the second printing pattern has mesh holes of a second size,
wherein the first printing pattern is closer to a periphery of the plate frame and surrounds the second printing pattern and has mesh holes that are larger than mesh holes for the second printing pattern, and
wherein the plurality of mesh holes are portions through which electrode paste is passed and the single opening is a portion where the electrode paste, after passing through the mesh holes, is retained to form a single electrode pattern.

2. The screen-printing plate according to claim 1, wherein bottom ends of the mesh holes are disposed above a bottom surface of the screen plate.

3. The screen-printing plate according to claim 1, wherein the two or more printing patterns are adapted to form corresponding printed patterns having substantially the same shape as one another.

4. A method for manufacturing an electronic device, comprising the steps of:
providing a screen plate having a single opening on one surface and a plurality of mesh holes on an opposite surface, and
forming two or more printed patterns on a ceramic green sheet by pressing electrode paste through the plurality of mesh holes in each of two or more printing patterns in the screen-printing plate and retaining the electrode paste in the single opening to form a single electrode pattern, wherein, for two of the two or more printing patterns, the shapes of the two printing patterns are substantially the same and the first printing pattern has mesh holes of a first size and the second printing pattern has mesh holes of a second size, and wherein electrode paste is pressed through a first group of mesh holes in a first region of the screen-printing plate having the first size and a second group of mesh holes in a second region of the screen-printing plate having the second size, and the second region is proximate a peripheral frame of the screen-printing plate and the first region is proximate a center of the screen-printing plate
wherein the first size is smaller than the second size and the second printing pattern surrounds the first printing pattern.

5. The method as set forth in claim 4, comprising the steps of
laminating and contact-bonding a plurality of ceramic green sheets, one or more electrode patterns being formed on at least one of the plurality of ceramic green sheets;
cutting the laminated and contact-bonded layered ceramic green sheets into independent elements; and
firing the cut elements.

6. The method as set forth in claim 4, wherein bottom ends of the mesh holes are disposed above a bottom surface of the screen plate and material pressed through the mesh holes is introduced into a space beneath each printing pattern.

7. The method as set forth in claim 4, comprising forming, with the two or more printing patterns, corresponding printed patterns having substantially the same shape as one another.

8. A screen-printing plate comprising:
a screen plate provided with two or more printing patterns disposed in a single plate frame of the screen plate, each of the two or more printing patterns being formed as a single opening on one surface of the screen plate and a plurality of mesh holes on an opposite surface of the screen plate,
wherein, for two of the two or more printing patterns, the shapes of the two printing patterns are substantially the same, one of two printing patterns surrounds the other, and the two printing patterns have different aperture ratios of the mesh holes, and
wherein the plurality of mesh holes are portions through which electrode paste is passed and the single opening is a portion where the electrode paste, after passing through the mesh holes, is retained to form a single electrode pattern.

9. The screen-printing plate according to claim 8, wherein mesh holes having a first aperture ratio are disposed in a first region of the screen plate and mesh holes having a second aperture ratio are disposed in a second region of the screen plate.

10. The screen-printing plate according to claim 9, wherein the first region of the screen plate is at a periphery of the plate frame, and the second region of the screen plate is at a portion of the screen plate closer to a center of the screen plate than the first region.

11. The screen-printing plate according to claim 10, wherein the first aperture ratio is higher than the second aperture ratio.

12. The screen-printing plate according to claim 8, wherein a first group of mesh holes is closer to a periphery of the plate frame than a second group of mesh holes and has a first aperture ratio that is higher than an aperture ratio for the second group of mesh holes.

13. The screen-printing plate according to claim 8, wherein bottom ends of the mesh holes are disposed above a bottom surface of the screen plate.

14. The screen-printing plate according to claim 8, wherein the two or more printing patterns are adapted to form corresponding printed patterns having substantially the same shape as one another.

15. A method for manufacturing an electronic device, comprising the steps of:

providing a screen plate having a single opening on one surface and a plurality of mesh holes on an opposite surface, and forming two or more printed patterns on a ceramic green sheet by pressing electrode paste through the plurality of mesh holes in each of two or more printing patterns in the screen-printing plate and retaining the electrode paste in the single opening to form a single electrode pattern, wherein, for two of the two or more printing patterns, the shapes of the two printing patterns are substantially the same, one of the two printing patterns surrounds the other, and the two printing patterns have different aperture ratios of the mesh holes.

16. The method as set forth in claim 15, comprising the steps of laminating and contact-bonding a plurality of ceramic green sheets, one or more electrode patterns being formed on at least one of the plurality of ceramic green sheets;

cutting the laminated and contact-bonded layered ceramic green sheets into independent elements; and firing the cut elements.

17. The method as set forth in claim 15, wherein electrode paste is pressed through a first group of mesh holes in a first region of the screen-printing plate having a first aperture ratio and a second group of mesh holes in a second region of the screen-printing plate having a second aperture ratio.

18. The method as set forth in claim 17, wherein the first region is proximate a peripheral frame of the screen-printing plate and the second region is proximate a center of the screen-printing plate.

19. The method as set forth in claim 18, wherein the first aperture ratio is higher than the second aperture ratio.

20. The method as set forth in claim 15, wherein the electrode paste is pressed through a first group of mesh holes that is closer to a periphery of the screen-printing plate than a second group of mesh holes and has a first aperture ratio that is higher than an aperture ratio for the second group of mesh holes.

21. The method as set forth in claim 15, wherein bottom ends of the mesh holes are disposed above a bottom surface of the screen plate and material pressed through the mesh holes is introduced into a space beneath each printing pattern.

22. The method as set forth in claim 15, comprising forming, with the two or more printing patterns, corresponding printed patterns having substantially the same shape as one another.

* * * * *